United States Patent [19]

Murphy et al.

[11] Patent Number: 4,942,001

[45] Date of Patent: Jul. 17, 1990

[54] METHOD OF FORMING A THREE-DIMENSIONAL OBJECT BY STEREOLITHOGRAPHY AND COMPOSITION THEREFORE

[75] Inventors: Edward J. Murphy, Des Plaines; Robert E. Ansel, Hoffman Estates; John J. Krajewski, Wheeling, all of Ill.

[73] Assignee: Inc. DeSoto, Des Plaines, Ill.

[21] Appl. No.: 429,568

[22] Filed: Oct. 31, 1989

Related U.S. Application Data

[63] Continuation-in-part of Ser. No. 162,983, Mar. 2, 1988, abandoned.

[51] Int. Cl.⁵ .................. B29C 35/08; C08F 4/32; C08F 26/10; C08F 120/18
[52] U.S. Cl. .................. 264/22; 264/236; 264/344; 264/347; 430/286; 522/44; 522/46; 522/96; 522/116; 522/120; 522/182; 526/227; 526/232; 526/264; 526/329.7
[58] Field of Search ............ 264/22, 236, 344, 347; 430/286, 916; 522/44, 46, 96, 116, 120, 182; 525/203, 205, 228, 418, 419, 451, 471; 526/227, 232, 264, 329.7

[56] References Cited

U.S. PATENT DOCUMENTS

| | | | |
|---|---|---|---|
| 2,899,402 | 8/1959 | Squire | 264/347 X |
| 2,972,170 | 2/1961 | Birckhead, Jr. et al. | 264/331.18 |
| 3,198,868 | 8/1965 | Pedretti et al. | 264/347 |
| 3,751,399 | 8/1973 | Lee, Jr. et al. | 526/232 |
| 3,939,049 | 2/1976 | Ratner et al. | 522/116 |
| 4,042,654 | 8/1977 | Leszyk et al. | 264/22 |
| 4,049,757 | 9/1977 | Kammel et al. | 264/22 |
| 4,060,678 | 11/1977 | Steckler | 526/227 X |
| 4,089,918 | 5/1978 | Kato et al. | 264/236 X |
| 4,181,752 | 1/1980 | Martens et al. | 522/182 X |
| 4,183,991 | 1/1980 | Smiley et al. | 524/35 |
| 4,361,689 | 11/1982 | Patel et al. | 526/264 |
| 4,379,201 | 4/1983 | Heilmann et al. | 522/44 X |
| 4,379,864 | 4/1983 | Gallop et al. | 526/264 X |
| 4,393,094 | 7/1983 | Garrett, Jr. et al. | 522/116 X |
| 4,430,458 | 2/1984 | Tighe et al. | 526/264 X |
| 4,446,220 | 5/1984 | Proskow | 430/286 |
| 4,575,330 | 3/1986 | Hull | 264/22 X |
| 4,636,534 | 1/1987 | Nawata et al. | 522/116 |
| 4,673,705 | 6/1987 | Ansel et al. | 524/850 |
| 4,701,509 | 10/1987 | Sun et al. | 526/264 |
| 4,734,143 | 3/1988 | Meoni | 264/22 X |

FOREIGN PATENT DOCUMENTS

| | | | |
|---|---|---|---|
| 109177 | 5/1984 | European Pat. Off. | 522/44 |
| 160957 | 11/1985 | European Pat. Off. | 522/46 |
| 52-68267 | 6/1977 | Japan | 264/236 |
| 56-152803 | 11/1981 | Japan | 522/46 |
| 61-114817 | 6/1986 | Japan | 264/22 |
| 61-114818 | 6/1986 | Japan | 425/174.4 |
| 61-116320 | 6/1986 | Japan | 425/174.4 |
| 61-116321 | 6/1986 | Japan | 425/174.4 |
| 61-116322 | 6/1986 | Japan | 425/174.4 |
| 61-154815 | 7/1986 | Japan | 264/22 |
| 61-217219 | 9/1986 | Japan | 264/22 |
| WO82/02559 | 8/1982 | PCT Int'l Appl. | 522/44 |

*Primary Examiner*—Jeffery Thurlow
*Assistant Examiner*—Leo B. Tentoni
*Attorney, Agent, or Firm*—Dressler, Goldsmith, Shore, Sutker & Milnamow

[57] ABSTRACT

A stereolithographic method which employs an ultraviolet-curable liquid composition adapted to cure rapidly to a lightly cross-linked solvent-swellable three-dimensional complexly-shaped polymeric thin-walled element constituted by heat-softenable solid polymer upon exposure to ultraviolet dosage in the range of about 0.1 to about 10 Joules per square centimeter and which possesses reduced distortion comprises, from 20 to 80 weight percent, of a resinous polyacrylate or polymethacrylate dissolved in a combination of 10 to 45 weight percent of a liquid polyacrylate or polymethacrylate, which is preferably trifunctional, and 10 to 45 weight percent of liquid N-vinyl monomer, preferably N-vinyl pyrrolidone. Thus, the weight ratio of polyacrylate: polymethacrylate: N-vinyl monomer is about 1:2:2 to about 8:1:1. One of the foregoing polyacrylates or polymethacrylates is a polyacrylate and the other is a polymethacrylate so that good cure speed is accompanied by good distortion resistance. In the method, a reservoir of the liquid composition is established and its exposed surface is irradiated to solidify the surface and build up a thin-walled element which is removed from the reservoir, drained of liquid adhering thereto and cured.

20 Claims, No Drawings

4,942,001

METHOD OF FORMING A THREE-DIMENSIONAL OBJECT BY STEREOLITHOGRAPHY AND COMPOSITION THEREFORE

CROSS-REFERENCE TO RELATED APPLICATION

This application is a continuation-in-part of U.S. Application Ser. No. 162,983 filed Mar. 2, 1988, now abandoned.

TECHNICAL FIELD

This invention relates to the production of stereolithographically formed elements which are complexly-shaped thin-walled polymeric objects and which are incompletely cured as a result of having been produced by an exposure to ultraviolet light which is inadequate to completely cure the polymer constituting the objects.

BACKGROUND ART

It is known, as illustrated in U.S. Pat. No. 4,575,330 to C. W. Hull, to form three-dimensional objects of complex shape using ultraviolet light to solidify superposed layers of liquid ultraviolet-curable ethylenically unsaturated material at the surface of a liquid reservoir of such material. Thin walled objects are formed in this manner, apparently thick walls being hollow and dimensionally stabilized by thin internal webs. The ultraviolet dosage is limited to speed the action and to insure that only the thin lines struck by the laser beam on the surface of the unsaturated liquid will be solidified.

As will be evident, the thin walled object is incompletely cured and has inadequate strength and durability. Of particular significance is the fact that these stereolithographic processes are intended to form three-dimensional models which conform as accurately as possible with what was intended, this usually being set forth in drawings which are cross-sectioned by computer to guide a laser beam in the production of the superposed layers. However, the incompletely cured products tend to be somewhat distorted, so the accuracy of the model is less than desired.

As a result, it is necessary to provide relatively low viscosity flowable liquid compositions which cure rapidly and which exhibit decreased distortion when only partially cured to possess some limited "green strength".

It is desired to point out that the ultraviolet lasers used have limited capacity, so a larger exposure dosage would slow the stereolithographic process. Moreover, a greater exposure would increase the thickness and depth of the exposed line which solidifies, thus reducing the dimensional accuracy of the stereolithographic process.

More particularly, the objects under consideration are formed by the ultraviolet polymerization of liquid ultraviolet-curable ethylenically unsaturated material at the surface of a liquid reservoir of such material using an ultraviolet dosage in the range of about 0.1 to about 10, preferably about 0.2 to about 5, Joules per square centimeter which is sufficient to convert the unsaturated liquid into a lightly cross-linked solvent-swellable three-dimensional complexly-shaped polymeric thin-walled element constituted by heat-softenable solid polymer. A support is positioned beneath the surface of the reservoir to hold the polymerized layer which is formed. The liquid level is then raised, or the support lowered, and another layer is formed until the photoformed object is completed within the liquid reservoir.

The photoformed objects are thus only partially cured and are somewhat gelatinous and mechanically weak due to the low degree of cross-linking and the presence of unconverted monomers and oligomers (which are still unsaturated) within the partially polymerized polymeric structure of the solid object which is formed. The problem of this application is to have a low viscosity liquid composition which cures rapidly to speed the stereolithographic process and which, at the same time, exhibits minimal distortion in its partially cured condition so that the gelatinous and weak solid products produced by ultraviolet exposure will accurately reflect the shape of the object which it is desired to reproduce.

It is desired to point out that the distortion which is encountered is a composite of the extent of shrinkage encountered during the cure, the strength of the partially cured polymer structure, and whatever mechanical stresses are imposed on the product before the object removed from the reservoir is further cured to strengthen the same.

After the partially cured object has been withdrawn from the reservoir, one can proceed in various ways to more completely cure (thermoset) these gelatinous and weak objects after they have been removed from the liquid ultraviolet-curable ethylenically unsaturated material in which they were formed, and one must be careful that the additional cure does not introduce additional distortion. Nonetheless, if the incompletely cured object is distorted, that distortion is retained when the cure is completed, and it is the minimization of the distortion in the incompletely cured object which is withdrawn from the reservoir which is the objective of this invention.

DISCLOSURE OF INVENTION

In accordance with this invention, the ultraviolet-curable liquid composition which is used in the process of the previously noted Hull patent is formulated to include from 20 to 80 weight percent, preferably from 35 to 70 weight percent, of a resinous polyacrylate or polymethacrylate. This resinous polyacrylate or polymethacrylate is dissolved in a combination of 10 to 40 weight percent, preferably from 15 to 30 weight percent, of a liquid polyacrylate or polymethacrylate, and 10 to 40 weight percent, preferably from 15 to 30 weight percent, of a liquid N-vinyl monomer. That is, the weight ratio of polyacrylate: polymethacrylate: N-vinyl monomer is about 1:2:2 to about 8:1:1, preferably about 7:6:6 to about 14:3:3.

It is important that one of the foregoing polyacrylates or polymethacrylates be a polyacrylate and that the other be a polymethacrylate. If both were polymethacrylates, the composition would cure too slowly. If both were polyacrylates, then severe distortion is seen.

More particularly, the above-described unsaturated liquid compositions are employed as a liquid reservoir which forms a thin liquid layer above a supporting platform, and the surface of this liquid reservoir is exposed to an ultraviolet dosage in the range of about 0.1 to about 10, preferably about 0.2 to about 5, Joules per square centimeter to partially cure the liquid at the surface. This process is repeated many times to superimpose one layer upon another and ultimately produce a three-dimensional object of partially cured polymer within the liquid reservoir.

The specified ultraviolet exposure is sufficient to convert the unsaturated liquid into a lightly cross-linked solvent-swellable three-dimensional complexly-shaped polymeric thin-walled element constituted by heat-softenable solid polymer. As a result, the photoformed objects are somewhat gelatinous and mechanically weak due to the low degree of cross-linking and the presence of unconverted monomers and oligomers (which are still unsaturated) within the partially polymerized polymeric structure of the solid object which is formed. In this invention, the liquid compositions specified are found to cure rapidly to a dimensionally stable solid condition which exhibits reduced distortion.

The resinous polyacrylate or polymethacrylate provides a polymeric matrix which allows the ultimately fully cured solid object to have the structural strength which is desired and the two other components provide the liquidity needed to have the easily flowable liquid which is required by the process. The N-vinyl monomer is rapid curing to enable the rapid achievement of "green strength", and the specified liquid polyacrylates or polymethacrylates, which are preferably illustrated by trimethylol propane trimethacrylate and pentaerythritol trimethacrylate, or the corresponding triacrylates, serve to reduce the distortion encountered in going from the drawings which activate the computer-directed laser beam and the three-dimensional model which is formed in the liquid reservoir.

The resinous polyacrylate or polymethacrylate which provides a polymeric matrix enabling the ultimately fully cured solid object to have its structural strength is subject to considerable variation so long as it is of resinous nature and contains an average of at least 2.0 acrylate or methacrylate groups per molecule. These can be illustrated by epoxy diacrylates, such as Epon 1001 diacrylate or Epon 828 diacrylate, or one can use polyester diacrylates. The corresponding methacrylates are also useful, but less preferred.

It is presently preferred to use polyurethane diacrylates, and especially those which employ a polyester base. More particularly, one can take an hydroxy-functional polyester, preferably one having an average of from 2.1-5.0 hydroxy groups per molecule, and react it with monoacrylate monoisocyanate to form an acrylate-capped polyurethane polyacrylate. One such product which is available in commerce is identified as Uvithane 893, and this commercial polyacrylate polyurethane polyester will be used in the Example of this application.

The preferred N-vinyl liquid monomer is N-vinyl pyrrolidone, N-vinyl caprolactam is also useful.

As previously indicated, it is preferred to combine a resinous polyacrylate with a liquid polymethacrylate. While liquid trimethacrylates are preferred, dimethacrylates are also useful, such as 1,6-hexane diol dimethacrylate. Liquid polymethacrylates of higher functionality are also useful, such as pentaerythritol tetraacrylate. When the resinous material is a polymethacrylate, the liquid material must be a polyacrylate, and 1,6-hexane diacrylate and polyacrylates of high functionality, like pentaerythritol tetramethacrylate can be used in such instance.

From about 1% to about 10% of a photoinitiator effective on ultraviolet exposure to initiate the polymerization of acrylate unsaturation is included in the reservoir, albeit the liquid compositions of this invention can be supplied without photoinitiator which is added by the user prior to use. These photoinitiators are themselves well known and in common use. They are usually ketonic, and frequently aromatic, such as benzophenone. It is presently preferred to use diethoxy acetophenone which is a particularly effective photoinitiator. It will be appreciated that photoinitiators for the ultraviolet polymerization of (meth)acrylate functional compounds are well known and in common use.

The energy that is utilized to cure the liquid composition is light in or near the ultraviolet range, i.e., light having a wavelength of about 200 to about 550, preferably about 250 to about 450, nanometers (nm). The term "near", as used in the phrase "near the ultraviolet range", refers to light at the lower end of the visible light spectrum.

As will be understood, after the 3-dimensional model (object) has been formed within the liquid reservoir, it is withdrawn and excess unsaturated liquid is allowed to drain therefrom, usually back into the reservoir from which it was withdrawn where it can be reused. If desired, one can wash the incompletely cured solid model with an alcoholic liquid before proceeding to complete the cure, but this is usually dispensed with and is not necessary.

The draining operation is a simple one which may be carried out at room or slightly elevated temperature to reduce the viscosity of the unconverted liquid adhering to the photoformed object. It is convenient to allow the object to drain for periods of from 5 to 10 minutes, albeit this is not critical.

Completion of the cure can be carried out in various ways. Most simply, the drained (and possibly washed) solid object is placed in an ultraviolet chamber and exposed uniformly to ultraviolet radiation to complete the cure. Other techniques are also possible for completing the cure, such as employing other more penetrating radiation or heat, and any of these may be used. It will be understood, however, that the specific technique employed to increase the strength of the incompletely polymerized object withdrawn from the polymerizable liquid reservoir is not itself the essence of this invention.

On the other hand, the compositions of this invention cure well when exposed to a temperature of about 250° F., and this is unusual. A thermal cure at a temperature up to about 325° F. is thus surprisingly effective and is a feature of this invention. Preferably the baking temperature will not exceed about 300° F. to insure avoidance of distortion during the cure. The thermal cure is advantageous since heat permeates all portions of the three-dimensional object whereas exposure of that object to ultraviolet light might not reach all portions of the object.

As previously indicated, the removal of polymerizable liquid clinging to the photoformed object can be aided by rinsing with an alcoholic solvent having the capacity to dissolve the polymerizable liquid, but which does not dissolve the partially polymerized solid formed from that liquid, albeit present practice does not usually employ such a wash.

A typical alcoholic solvent is represented by an alcohol, such as isopropanol. If desired, one may add a minor proportion of an ester solvent, such as butyl acetate. Other useful alcohols are illustrated by ethyl alcohol and butanol. When water-miscible solvents are used, water may be present in the solvent mixture.

The time of immersion in the alcoholic wash composition is of secondary significance, albeit it is convenient to immerse the object in the solvent at room temperature for from 5 to 30 seconds to dissolve the adhering polymerizable liquid. The partially cured object is then removed and adhering solvent is allowed to drain therefrom.

An illustration of a (meth)acrylate-functional photocurable liquid which is useful to provide the bath of liquid ultraviolet-curable ethylenically unsaturated material the surface of which is exposed to ultraviolet radiation in accordance with this invention is provided by mixing 60 grams of a polyacrylate-functional polyurethane polyester resin (Uvithane 893 may be used) 20 grams of trimethylol propane trimethacrylate, 20 grams of N-vinyl pyrrolidone and 4 grams of a benzyl ketal-based photoinitiator (Darocur 1173 available from EM Chemicals). Another photoinitiator which is fully useful in this example in the same proportion is Irgacure 184 available from Ciba Geigy Corporation.

The liquid bath of this photopolymerizable liquid was exposed to ultraviolet light using a Liconix model 4240 N, helium-cadmium light having an output of 15 milliwatts at 325 nanometers focused to 350 micron diameter. The usual dosage is about 3.0 Joules per square centimeter of surface which results in test specimens of about 20 mil thickness.

After draining for 10 minutes, the drained piece may be washed briefly in an alcoholic solvent mixture of isopropanol and butyl acetate in a weight ratio of 64/33 to facilitate complete removal of polymerizable liquid, but in this example washing was not employed.

The drained parts were then exposed to ultraviolet light in a sealed chamber, and the exposure was continued until the parts are as fully cured as desired.

Repeating the foregoing, but using an oven at 300° F. to provide the post-cure, a good cure is obtained in about 10 minutes.

The above example is also repeated by mixing 60 grams of a polymethacrylate-functional resin (the dimethacrylate of Shell Chemical Company product Epon 1001 which is a diglycidyl ether of bisphenol A having a number average molecular weight of about 1000) 20 grams of trimethylol propane triacrylate, 20 grams of N-vinyl pyrrolidone and 4 grams of a benzyl ketal-based photoinitiator (Darocur 1173 available from EM Chemicals). Corresponding results are obtained.

What is claimed is:

1. An ultraviolet-curable liquid composition adapted to cure rapidly to a lightly cross-linked solvent-swellable three-dimensional complexly-shaped polymeric thin-walled element constituted by heat-softenable solid polymer upon exposure to ultraviolet dosage in the range of about 0.1 to about 10 Joules per square centimeter and which possesses reduced distortion comprising, from 20 to 80 weight percent, of a resinous polyacrylate or polymethacrylate dissolved in a combination of 10 to 40 weight percent of a liquid polyacrylate or polymethacrylate, one of the foregoing being a polyacrylate and the other being a polymethacrylate, and 10 to 30 weight percent of a liquid N-vinyl monomer.

2. An ultraviolet-curable liquid composition as recited in claim 1 in which the ultraviolet dosage is in the range of about 0.2 to about 5 Joules per square centimeter.

3. An ultraviolet-curable liquid composition as recited in claim 1 in which said resinous polyacrylate is used in an amount of from 45 to 70 weight percent.

4. An ultraviolet-curable liquid composition as recited in claim 1 in which said liquid polyacrylate or polymethacrylate is at least trifunctional and is used in an amount of from 15 to 30 weight percent.

5. An ultraviolet-curable liquid composition as recited in claim 4 in which said at least trifunctional liquid is a polymethacrylate.

6. An ultraviolet-curable liquid composition as recited in claim 5 in which said liquid is a polymethacrylate is trimethylol propane trimethacrylate.

7. An ultraviolet-curable liquid composition as recited in claim 1 in which said N-vinyl monomer is used in an amount of from 15 to 30 weight percent.

8. An ultraviolet-curable liquid composition as recited in claim 7 in which said N-vinyl monomer is N-vinyl pyrrolidone.

9. An ultraviolet-curable liquid composition as recited in claim 1 in which said composition includes from 1 to 10 weight percent of a photoinitiator effective to initiate the ultraviolet cure of (meth)acrylate functionality.

10. The composition as recited in claim 1 wherein the weight ratio of polyacrylate: polymethacrylate: N-vinyl monomer is about 1:2:2 to about 8:1:1.

11. The composition as recited in claim 1 wherein the weight ratio of polyacrylate: polymethacrylate: N-vinyl monomer is about 7:6:6 to about 14:3:3.

12. An ultraviolet-curable liquid composition adapted to cure rapidly to a lightly cross-linked solvent-swellable three-dimensional complexly-shaped polymeric thin-walled element constituted by heat-softenable solid polymer upon exposure to ultraviolet dosage in the range of about 0.2 to about 5 Joules per square centimeter and which possesses reduced distortion comprising, from 45 to 70 weight percent, of a resinous polyacrylate dissolved in a combination of 15 to 30 weight percent of a liquid trimethacrylate and 15 to 30 weight percent of a liquid N-vinyl pyrrolidone or a liquid N-vinyl caprolactam.

13. A method of forming a three-dimensional thin-walled object comprising, providing a reservoir of liquid ultraviolet-curable ethylenically unsaturated material comprising, from 20 to 80 weight percent, of a resinous polyacrylate or polymethacrylate dissolved in a combination of 10 to 35 weight percent of a liquid polyacrylate or polymethacrylate, one of the foregoing being a polyacrylate and the other being a polymethacrylate, and 10 to 40 weight percent of liquid N-vinyl monomer, exposing the surface of said reservoir to a beam of ultraviolet light to apply a dosage in the range of about 0.1 to about 10 Joules per square centimeter to said surface to solidify the liquid near said surface to form a plurality of superposed layers of lightly cross-linked solvent-swellable three-dimensional complexly-shaped polymeric thin-walled element constituted by heat-softenable solid polymer in said reservoir, removing said element from said reservoir, draining excess polymerizable liquid from said element, and then completing the cure of said element to strengthen the same.

14. A method as recited in claim 13 in which said drained element is cured by exposure to ultraviolet light.

15. A method as recited in claim 13 in which said drained element is cured by exposure to heat at a temperature not in excess of about 325° F.

16. A method as recited in claim 13 in which said drained element is cured by exposure to heat at a temperature of from about 250° F. to about 300° F.

17. A light curable liquid composition comprising 20 to 80 weight percent of a resinous polyacrylate or polymethacrylate dissolved in a combination of 10 to 40 weight percent of a liquid polyacrylate or polymethacrylate and 10 to 30 weight percent of a liquid N-vinyl monomer, the weight ratio of polyacrylate: polymethacrylate: N-vinyl monomer being about 1:2:2 to about 8:1:1.

18. The composition as recited in claim 17 wherein the resinous polyacrylate or polymethacrylate is present in an amount of about 45 to 70 weight percent, the liquid polyacrylate or polymethacrylate is present in an amount of about 15 to 30 weight percent and the N-vinyl monomer is present in an amount of about 15 to 30 weight percent.

19. The composition as recited in claim 17 wherein the weight ratio of polyacrylate: polymethacrylate: N-vinyl monomer is about 7:6:6 to about 14:3:3.

20. The composition as recited in claim 19 wherein the resinous polyacrylate or polymethacrylate is present in an amount of about 45 to 70 weight percent, the liquid polyacrylate or polymethacrylate is present in an amount of about 15 to 30 weight percent and the N-vinyl monomer is present in an amount of about 15 to 30 weight percent.

* * * * *